(12) United States Patent
Cho et al.

(10) Patent No.: US 8,866,141 B2
(45) Date of Patent: Oct. 21, 2014

(54) THIN FILM TRANSISTOR AND METHOD FOR FABRICATING THE SAME

(71) Applicant: LG Display Co., Ltd., Seoul (KR)

(72) Inventors: KiSul Cho, Gyeongsangbuk-Do (KR); MiKyung Park, Busan (KR); JaeYeong Choi, Seoul (KR)

(73) Assignee: LG Display Co., Ltd., Seoul (KR)

( * ) Notice: Subject to any disclaimer, the term of this patent is extended or adjusted under 35 U.S.C. 154(b) by 19 days.

(21) Appl. No.: 13/726,802

(22) Filed: Dec. 26, 2012

(65) Prior Publication Data

US 2013/0264570 A1    Oct. 10, 2013

(30) Foreign Application Priority Data

Apr. 10, 2012  (KR) .......................... 10-2012-0037527

(51) Int. Cl.
| | | |
|---|---|---|
| H01L 21/00 | (2006.01) | |
| H01L 29/786 | (2006.01) | |
| H01L 29/66 | (2006.01) | |
| H01L 27/07 | (2006.01) | |
| H01L 29/417 | (2006.01) | |

(52) U.S. Cl.
CPC .... *H01L 29/78669* (2013.01); *H01L 29/78678* (2013.01); *H01L 29/6675* (2013.01); *H01L 29/78645* (2013.01); *H01L 27/0705* (2013.01); *H01L 29/41733* (2013.01); *H01L 29/66969* (2013.01); *H01L 29/7869* (2013.01)
USPC .......................................................... 257/57

(58) Field of Classification Search
USPC .......................................................... 257/57
See application file for complete search history.

(56) References Cited

U.S. PATENT DOCUMENTS

| 7,709,840 B2 * | 5/2010 | Lee ................................ 257/59 |
| 8,471,255 B2 * | 6/2013 | Okabe ............................ 257/57 |
| 2006/0017681 A1 * | 1/2006 | Jang et al. ...................... 345/98 |
| 2010/0059750 A1 * | 3/2010 | Lim et al. ........................ 257/57 |
| 2010/0096630 A1 * | 4/2010 | Peng et al. ...................... 257/57 |
| 2010/0176399 A1 * | 7/2010 | Takeguchi ....................... 257/57 |
| 2011/0227075 A1 * | 9/2011 | Stainer et al. ................... 257/57 |

FOREIGN PATENT DOCUMENTS

| KR | 10-1016291 | 2/2011 |
| KR | 10-2011-0058076 | 6/2011 |

OTHER PUBLICATIONS

Korean Office Action for corresponding Korean Patent Application No. 10-2012-0037527 dated Aug. 27, 2013.

* cited by examiner

*Primary Examiner* — Thao P Le
(74) *Attorney, Agent, or Firm* — Morgan, Lewis & Bockius LLP

(57) ABSTRACT

A thin film transistor and a method for fabricating the same are disclosed. The thin film transistor includes: a gate electrode formed on a substrate and having a plurality of horizontal electrode parts spaced apart at regular intervals; a gate insulating film formed over the entire surface of the substrate including the gate electrode; an active pattern formed on the gate insulating film above the plurality of horizontal electrode parts; an etch stop film pattern formed above the active pattern and the gate insulating film so as to overlap top portions of the active pattern and the gate electrode and; a source electrode formed on the active pattern, the gate insulating film, and the etch stop film pattern so as to overlap top portions of adjacent horizontal electrode parts; and a drain electrode formed on the active pattern, the gate insulating film, and the etch stop film pattern so as to overlap top portions of horizontal electrode parts located on the outermost ends.

16 Claims, 10 Drawing Sheets ly on substrates greater than about 2 m×2 m in area at
THIN FILM TRANSISTOR AND METHOD FOR FABRICATING THE SAME

CROSS-REFERENCE TO RELATED APPLICATIONS

This application claims the benefit of Korean Patent Application No. 10-2012-0037527, filed on Apr. 10, 2012, which is hereby incorporated by reference for all purposes as if fully set forth herein.

BACKGROUND OF THE INVENTION

1. Field of the Invention

The present disclosure relates to a thin film transistor (hereinafter, referred to as TFT), and more particularly, to a thin film transistor which is suitable as a switching element or driving element for a semiconductor device, as well as for a display device, such as an organic light emitting diode (hereinafter, OLED) and a liquid crystal display device (hereinafter, LCD), and a method for fabricating the same.

2. Background of the Invention

Displays such as an organic light emitting diode (OLED) and liquid crystal display (LCD) may have a thin film transistor (TFT) as a switching element or driving element.

Conventionally, amorphous silicon TFTs (a-Si TFTs) are used as driving and switching elements for displays. Conventional a-Si TFTs are elements that may be formed relatively uniformly on substrates greater than about 2 m×2 m in area at relatively low costs and are widely used as driving and switching elements. With recent trends towards larger-sized and higher image quality displays, TFTs require higher performance. But, conventional a-Si TFTs with mobility of about 0.5 cm2/Vs may be limited in their application. In this regard, higher-performance TFTs with higher mobility than conventional a-Si TFTs and technologies for fabricating such higher-performance TFTs may be needed. When a polysilicon thin film transistor is used as a channel layer of a thin film transistor, its electron mobility is excellent, but its fabrication process is difficult and its fabrication cost is high.

Accordingly, new TFT technologies having the merits of amorphous silicon thin film transistors and the merits of polysilicon thin film transistors are required.

Recently, a thin film transistor using a semiconductor oxide as a channel was proposed. An oxide TFT has higher mobility than an a-Si TFT, and its fabrication process is simpler than that of a poly-Si TFT and its fabrication cost is low. Hence, the oxide TFT is highly useful as a liquid crystal display (LCD) and an organic light emitting diode (OLED).

In this regard, a conventional thin film transistor structure will be described below with reference to FIGS. 1 and 2.

FIG. 1 is a plan view of a thin film transistor structure according to the prior art.

FIG. 2 is a cross-sectional view of the thin film transistor structure according to the prior art, taken along line II-II of FIG. 1.

As shown in FIGS. 1 and 2, a conventional bottom gate type thin film transistor includes a gate electrode 13 patterned on a substrate 11 to have a given width and length, a gate insulating film 15 formed over the entire surface of the substrate 11 including the gate electrode 13, an active pattern 17a made of a semiconductor oxide patterned in a given shape on the gate insulating film 15 above the gate electrode 13, an etch stop film pattern 19a formed on the active pattern 17a so as to overlap a top portion of the gate electrode 13, a source electrode 21a formed on the etch stop film pattern 19a, active layer 17a, and gate insulating film 15 so as to overlap one side of the top of the gate electrode 13, and a drain electrode 21b formed on the etch stop film pattern 19a, active layer 17a, and gate insulating film 15 so as to overlap the other side of the top of the gate electrode 13.

The drain electrode 21b is separate from the source electrode by a predetermined distance. In a liquid crystal display, though not shown, the gate electrode 13 protrudes from a gate line (not shown) having one direction, and the source electrode 21a protrudes from a data line (not shown).

A method for fabricating a thin film transistor according to the prior art will be described below with reference to FIGS. 3a to 3e.

FIGS. 3a to 3e are cross-sectional views of a fabrication process of a thin film transistor structure according to the prior art.

Referring to FIG. 3a, a conductive metal material is deposited on a substrate 11 to form a first metal material layer (not shown), and then the first metal material layer is selectively patterned through a first mask process to form a gate electrode 13.

Next, referring to FIG. 3b, an inorganic insulating material is deposited on the substrate 10 with the gate electrode 13 formed thereon, and then a semiconductor oxide is deposited on the gate insulating film 15 to form an active layer 17.

Next, referring to FIG. 3c, the active layer 17 is selectively patterned through a second mask process to form an active pattern 17a, and an insulating material is deposited over the entire surface of the substrate including the active pattern 17a to form an etch stop film 19.

Next, referring to FIG. 3d, the etch stop film 19 is selectively patterned through a third mask process to thereby form an etch stop film pattern 19a overlapping the top of the gate electrode 13.

Subsequently, a conductive metal material is deposited over the entire surface of the substrate including the etch stop film pattern 19a to form a second metal material layer 21.

Next, referring to FIG. 3e, the second metal material layer 21 is selectively patterned through a fourth mask process to form a source electrode 21a and a drain electrode 21b separated from each other, thereby completing the fabrication of an oxide TFT according to the prior art. The source electrode 21a is formed on the etch stop film pattern 19a, active layer 17a, and gate insulating film 15 so as to is overlap one side of the top of the gate electrode 13, and the drain electrode is formed on the etch stop film pattern 19a, active layer 17a, and gate insulating film 15 so as to overlap the other side of the top of the gate electrode 13.

FIG. 4 schematically shows graphs of drain current versus gate voltage according to the thin film transistor structure of the prior art.

Graphs A and B are graphs of drain current versus gate voltage, in which the graph A shows a variation in the current flowing the source electrode to the drain electrode, and the graph B shows a variation in the current flowing the drain electrode to the source electrode.

Accordingly, as shown in FIG. 4, it can be found that there is a large difference between the variation in the current flowing the source electrode to the drain electrode and the variation in the current flowing the drain electrode to the source electrode. Especially, there occurs a difference in overlap width between the source and drain electrodes overlapping the gate electrode due to misalignment during the fabrication of a thin film transistor. Such a difference in overlap width causes a variation in drain current versus gate voltage. That is, due to misalignment, there is a shift by a given width between the graph A of current flowing the source electrode S to the drain electrode and D and the graph B of current flowing the drain electrode D to the source electrode S.

FIG. 5 schematically shows graphs of drain current versus voltage (drain-source voltage) according to the thin film transistor structure of the prior art.

Referring to FIG. 5, there occurs a difference in overlap width between the source and drain electrodes overlapping the gate electrode due to misalignment during the fabrication of a thin film transistor. Hence, it can be found that, as shown in "C", the drain current Id is not kept constant and the output saturation characteristics are not good.

As discussed above, the TFT structure and the method for fabricating the same according to the prior art have the following problems.

According to the TFT structure and the method for fabricating the same according to the prior art, there occurs a difference in overlap width between the source and drain electrodes overlapping the gate electrode due to misalignment during the fabrication of a thin film transistor. Such a difference in overlap width causes a variation in drain current versus gate voltage. That is, due to misalignment, there is a shift by a given width between the graph A of current flowing the source electrode S to the drain electrode and D and the graph B of current flowing the drain electrode D to the source electrode S, and the output saturation characteristics are not good. This results in severe mura, afterimage, and picture quality degradation when the TFT structure of the prior art is applied to the OLED.

Moreover, when the TFT structure of the prior art is applied to the OLED, if the current level is low, this leads to an increase in power consumption with respect to the same voltage during organic light emission

SUMMARY OF THE INVENTION

Therefore, an aspect of the detailed description is to solve the problems occurring in the related art and to provide a thin film transistor which can overcome many problems arising during a fabrication process and ensure high current characteristics by varying a thin film transistor structure and a method for fabricating the same.

To accomplish the above object, there is provided a thin film transistor according to the present invention including: a gate electrode formed on a substrate and having a plurality of horizontal electrode parts spaced apart at regular intervals; a gate insulating film formed over the entire surface of the substrate including the gate electrode; an active pattern formed on the gate insulating film above the plurality of horizontal electrode parts; an etch stop film pattern formed above the active pattern and the gate insulating film so as to overlap top portions of the active pattern and the gate electrode and; a source electrode formed on the active pattern, the gate insulating film, and the etch stop film pattern so as to overlap top portions of adjacent horizontal electrode parts; and a drain electrode formed on the active pattern, the gate insulating film, and the etch stop film pattern so as to overlap top portions of horizontal electrode parts located on the outermost ends.

To accomplish the above object, there is provided a method for fabricating a thin film transistor according to the present invention including the steps of: forming a gate electrode on a substrate and having a plurality of horizontal electrode parts spaced apart at regular intervals; forming a gate insulating film formed the entire surface of the substrate including the gate electrode; forming an active pattern on the gate insulating film above the plurality of horizontal electrode parts; forming an etch stop film pattern above the active pattern and the gate insulating film so as to overlap top portions of the active pattern and the gate electrode; forming a source electrode on the active pattern, the gate insulating film, and the etch stop film pattern so as to overlap top portions of adjacent horizontal electrode parts; and forming a drain electrode on the active pattern, the gate insulating film, and the etch stop film pattern so as to overlap top portions of horizontal electrode parts located on the outermost ends.

The thin film transistor and method for fabricating the same according to the present invention provide the following effects.

As discussed above, in the thin film transistor and the method for fabricating the same according to the present invention, the thin film transistor structure is varied such that a gate electrode includes a plurality of horizontal electrode parts and a drain electrode overlaps at least two horizontal electrode parts located on the outermost ends of the gate electrode. Even if there is an overlap difference between the source and drain electrodes overlapping horizontal electrode parts of the gate electrode due to misalignment, the overlap difference can be compensated for by other adjacent horizontal electrode parts. Consequently, there is little difference between the variation in the current flowing the source electrode to the drain electrode and the variation in the current flowing the drain electrode to the source electrode.

Moreover, in the thin film transistor and the method for fabricating the same according to the present invention, even if there is an overlap difference between the source and drain electrodes overlapping horizontal electrode parts of the gate electrode due to misalignment during the fabrication of a thin film transistor, the overlap difference can be compensated for by other adjacent horizontal electrode parts. Consequently, there is little difference between the variation in the current flowing the source electrode to the drain electrode and the variation in the current flowing the drain electrode to the source electrode. Hence, the drain current versus the drain-source voltage shows good output saturation characteristics.

Also, the method for fabricating the thin film transistor structure according to the present invention has high electron mobility and requires low production cost in the fabrication because the active pattern is made of oxide semiconductor including silicon. Moreover, the fabrication process of the active pattern can be performed at ambient temperature, thus making the process easy.

Further, according to the thin film transistor and the method for fabricating the same according to the present invention, even if the active pattern is made of LTPS, the off current $I_{off}$ of the thin film transistor can be reduce because an offset pattern is formed between the source electrode and the drain electrode.

Accordingly, the thin film transistor and the method for fabricating a thin film transistor structure according to the present invention may be applied to a variety of electronic devices, including driving or switching elements for flat panel displays, such as a liquid crystal display (hereinafter, LCD) and an organic light emitting diode (hereinafter, OLED), and devices for configuring peripheral circuits of memory devices.

BRIEF DESCRIPTION OF THE DRAWINGS

The accompanying drawings, which are included to provide a further understanding of the invention and are incorporated in and constitute a part of this specification, illustrate exemplary embodiments and together with the description serve to explain the principles of the invention.

In the drawings.

DETAILED DESCRIPTION OF THE INVENTION

Hereinafter, a thin film transistor structure according to the present invention will be described with reference to the accompanying drawings.

Figure 1:
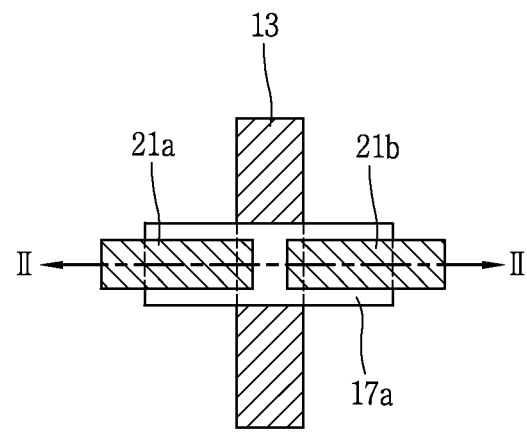
FIG. 1 is a plan view of a thin film transistor structure according to the prior art.
Figure 2:
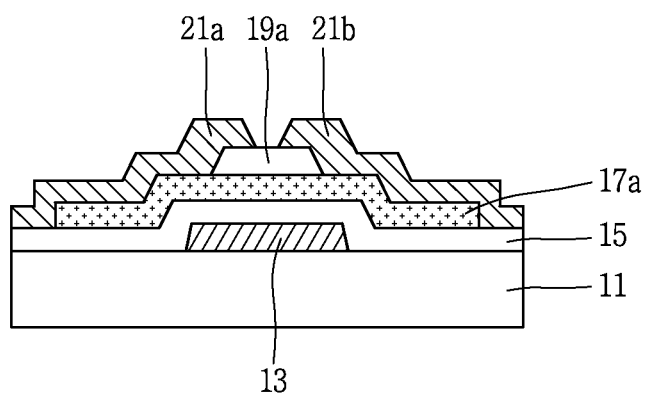
FIG. 2 is a cross-sectional view of a thin film transistor structure according to the prior art, taken along line II-II of FIG. 1.
Figure 3A:
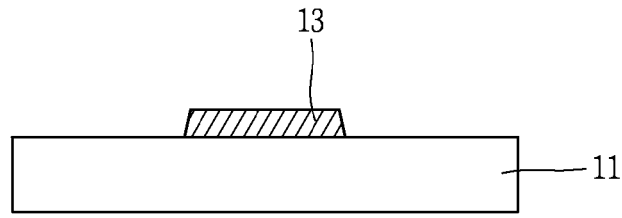
FIGS. 3a to 3e are cross-sectional views of a fabrication process of a thin film transistor structure according to the prior art.
Figure 3B:
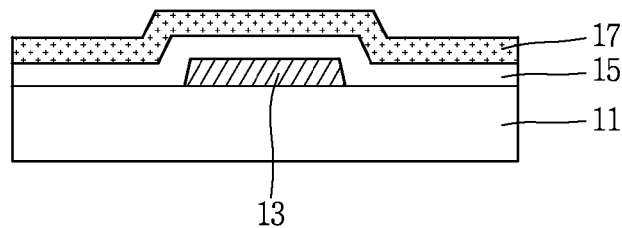
Figure 3C:
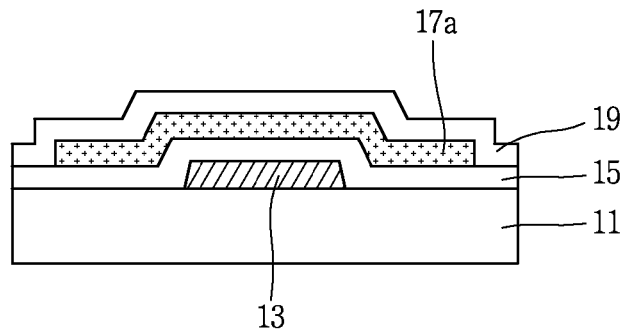
Figure 3D:
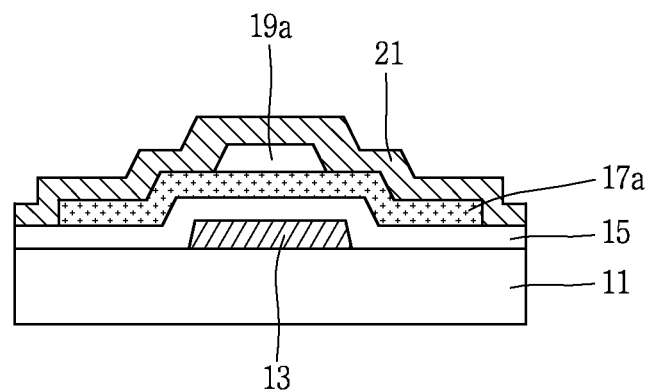
Figure 3E:
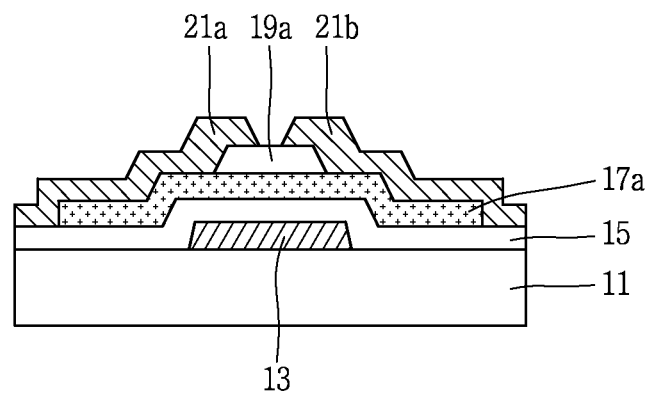
Figure 4:
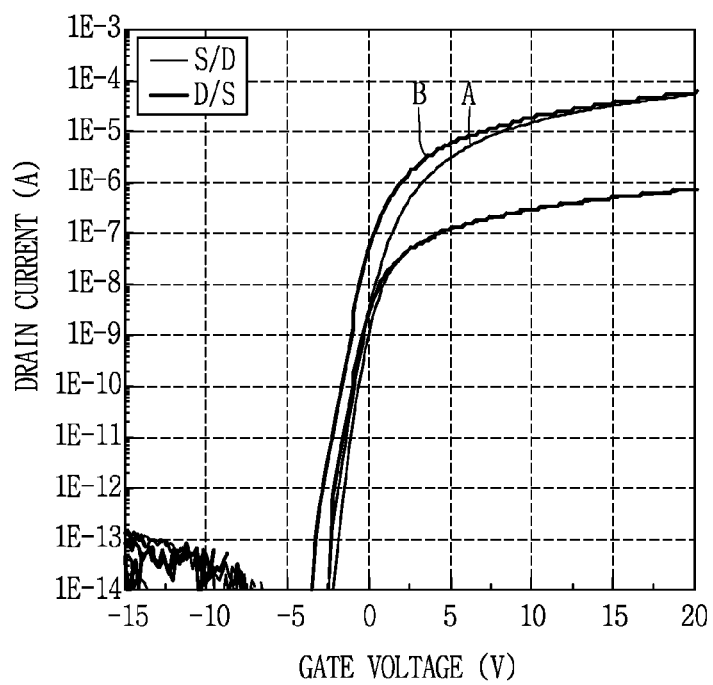
FIG. 4 schematically shows graphs of drain current versus gate voltage according to the thin film transistor structure of the prior art.
Figure 5:
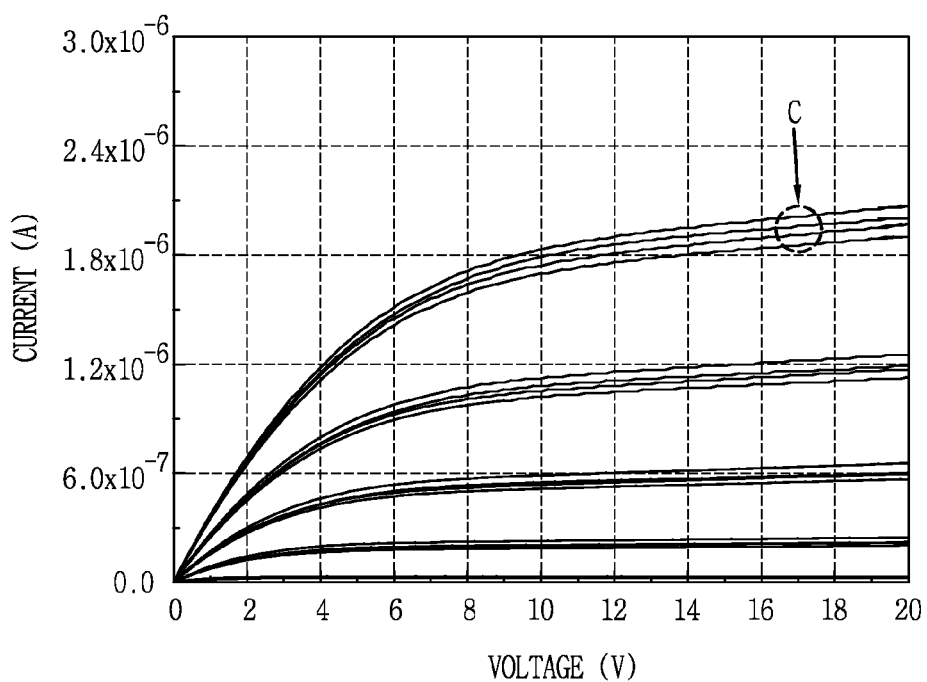
FIG. 5 schematically shows graphs of drain current versus voltage (drain-source voltage) according to the thin film transistor structure of the prior art.
Figure 6:
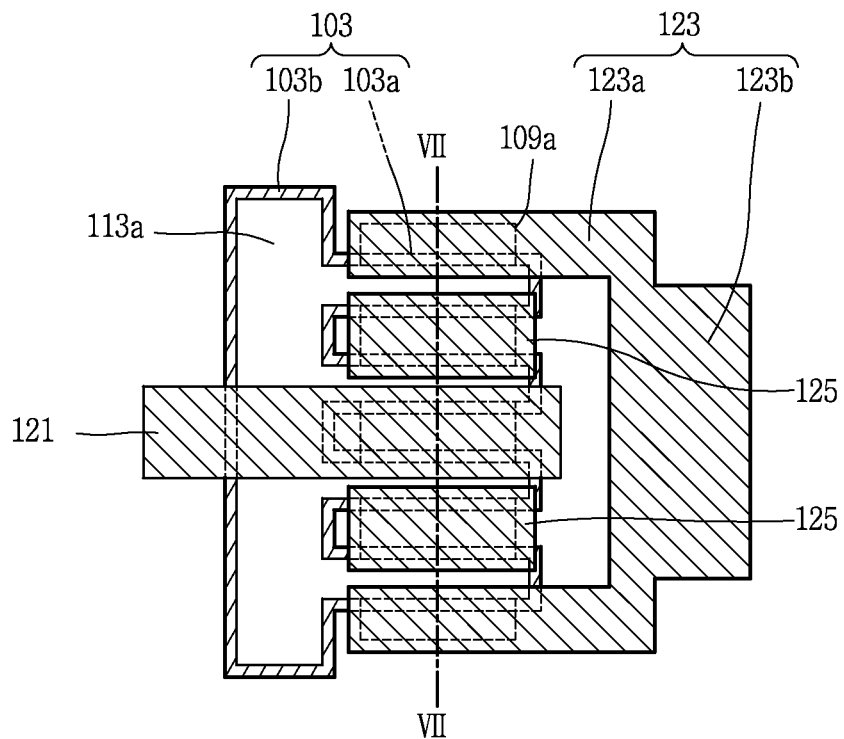
FIG. 6 is a plan view of a thin film transistor according to the present invention.

FIG. 6 is a plan view of a thin film transistor according to the present invention.

Figure 7:
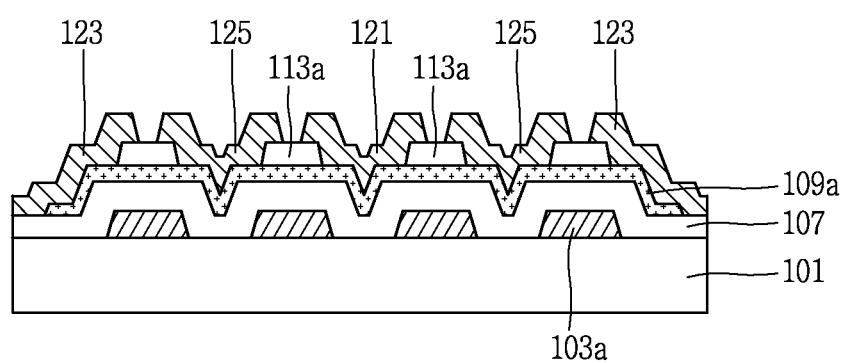
FIG. 7 is a cross-sectional view of a thin film transistor structure according to the present invention, taken along line VII-VII.

FIG. 7 is a cross-sectional view of a thin film transistor structure according to the present invention, taken along line VII-VII As shown in FIGS. 6 and 7, a thin film transistor according to the present invention includes: a gate electrode 103 patterned on a substrate 101 to have a given width and length, and including a plurality of horizontal electrode parts 103a spaced apart at regular intervals and a vertical electrode part 103b; a gate insulating film 107 formed over the entire surface of the substrate 101 including the gate electrode 103; an active pattern 109a formed in a given shape on the gate insulating film 107 above the plurality of horizontal electrode parts 103a; an etch stop film pattern 113a formed above the active layer 109a and the gate insulating film 107; a source electrode 121 overlapping top portions of adjacent horizontal electrode parts 103a and formed on the active pattern 109a, the gate insulating film 107, and the etch stop film pattern 113a; and a drain electrode overlapping top portions of horizontal electrode parts 103a located on the outermost ends and formed on the active pattern 109a, the gate insulating film 107, and the etch stop film pattern 113a.

An offset pattern 125 is formed between the source electrode 121 and the drain electrode 123. The offset pattern 125 overlaps top portions of adjacent horizontal electrode parts 103a, and is formed on the active pattern 109a and the gate insulating film 107.

The offset pattern 125 is spaced apart from the source electrode 121 and the drain electrode 123, and disposed in parallel. The offset pattern 125 serves to reduce the off current Ioff of the thin film transistor structure.

The active pattern 109a perpendicularly overlaps the plurality of horizontal electrodes 103a constituting the gate electrode 103.

The source electrode 121 perpendicularly overlaps the vertical electrode part 103b constituting the gate electrode 103. Moreover, the source electrode 121 is disposed between the horizontal electrode parts 103a located on the outermost ends.

Further, the drain electrode 123 is divided into at least two first electrode parts 123a and a second electrode part 123b. The two first electrode parts 123a overlap top portions of the horizontal electrode parts 103a located on the outermost ends, and the second electrode part 123b is connected to the two first electrode parts 123a.

The gate electrode 103a may be made of silicon, glass, plastic, or other suitable material, or made of a metal or other suitable conductive material. For example, the gate electrode 103a may be made of any one selected from the group consisting of indium tin oxide (ITO), indium gallium oxide (GZO), indium gallium zinc oxide (IGZO), indium gallium oxide (IGO), indium zinc oxide (IZO), indium zinc oxide (IZO), and $In_2O_3$, or two or more combinations of these materials, or other suitable materials. Alternatively, the gate electrode 103a may be made of any one selected from the group consisting of Al, W, Cu, Mo, Cr, Ti, MoW, MoTi, and Cu/MoTi, or two or more combinations of these materials, or other suitable materials.

The gate insulating film 107 may be made of any one selected from the group consisting of $SiO_2$, SiNx, $ZrO_2$, $HfO_2$, $TiO_2$, $Ta_2O_5$, and Ba—Sr—Ti—O, or two or more combinations of these materials, or other suitable materials.

The active pattern 109a is a layer for forming a channel for moving electrons between the source electrode 121 and the drain electrode 123. The active pattern 109a may be made of oxide semiconductor containing silicon Si, low-temperature polysilicon (hereinafter, referred to as LTPS), or amorphous silicon (a-Si) material.

The oxide semiconductor includes Zn and one or more selected from the group consisting of Ge, Sn, Pb, In, Ti, Ga, and Al to which silicon (Si) is added. For example, the active pattern 109a may be made of Si—InZnO (SIZO) including InZnO to which silicon ions are added.

Particularly, the silicon ions control the electron concentration of InZnO to be suitable for a thin film transistor. Silicon has an electronegativity of about 1.8, and therefore has a difference in electronegativity of about 1.7 with oxygen having an electronegativity of about 3.5. Thus, silicon forms an oxide having a strong ionic bond.

Silicon has an ionic radius of about 0.040 nm, which is smaller than that of Zn, which has an ionic radius of about 0.074 nm and that of indium, which has an ionic radius of about 0.08 nm.

Accordingly, if the InZnO has silicon added thereto, an interstial solid solution may be generated.

Since the Si—InZnO is formed from an ionic bond, it has a relatively large electron cloud of cations. An overlap occurs regardless of binding of oxygen anions, and hence there are no weak bonds irrespective of whether they are in a crystal phase or amorphous phase. Thus, little change or only a small change in threshold voltage (Vth) is observed, thus contributing to the fabrication of a reliable TFT. In the embodiment, the oxide semiconductor including silicon may be mainly formed of ionic groups, but all of the bindings need not be ionic bonds.

Although the characteristics of the active pattern 109a have been described above with reference to SIZO, the active pattern 109a made of SIZO is shows good transistor characteristics even at a relatively low temperature. However, this is mere an illustration, and the active pattern 109a, which includes Zn and one or more selected from the group consisting of Ge, Sn, Pb, In, Ti, Ga, and Al to which silicon (Si) is added, has similar advantages to those of the active pattern 109a made of SIZO.

In one embodiment, the active pattern 109a made of oxide semiconductor including silicon may have a carrier concentration of about $10^8/cm^3$ to $10^{22}/cm^3$. The active pattern 109a may be used as a channel element of the thin film transistor because it shows semiconductor device characteristics at a carrier concentration below about $10^{17}/cm^3$. Also, the active pattern 109a may be used as an electrode material because it shows similar characteristics to those of metals at a carrier concentration of about $10^{17}/cm^3$ to $10^{22}/cm^3$. For example, the active pattern 109a may be used as a transparent conducting oxide (hereinafter, referred to as TOO). Especially, as the active pattern 109a is deposited at a higher temperature, it becomes more applicable to an electrode.

If the active pattern 109a is made of SIZO, the content ratio of Si atoms relative to the total content of Zn, In, and Si atoms in the active layer may range from about 0.001% by weight to about 30% by weight. The higher the content of Si atoms, the more strongly it controls electron generation. This may decrease mobility but improve the stability of the device.

The active pattern 109a may further include elements of Group I such as Li and K, elements of Group II such as Mg, Ca, and Sr, elements of Group III such as Ga, Al, In, and Y, elements of Group IV such as Ti, Zr, Si, Sn, and Ge, elements of Group V such as Ta, Vb, Nb, and Sb, elements belonging to the lanthanide series such as La, Ce, Pr, Nd, Pm, Sm, Eu, Gd, Tb, Dy, Ho, Er, Tm, Yb, and Lu, or the like.

The source electrode 121 and the drain electrode 123 may be made of the same material. Like the gate electrode 103a, the source electrode 121 and the drain electrode 123 may be made of a metal or other suitable conductive material. For example, the source electrode 121 and the drain electrode 123 may be made of any one selected from the group consisting of indium tin oxide (ITO), indium gallium oxide (GZO), indium gallium zinc oxide (IGZO), indium gallium oxide (IGO), indium zinc oxide (IZO), indium zinc oxide (IZO), and $In_2O_3$, or two or more combinations of these materials, or other suitable materials. Alternatively, the source electrode 121 and the drain electrode 123 may be made of any one selected from the group consisting of Al, W, Cu, Mo, Cr, Ti, MoW, MoTi, and Cu/MoTi, or two or more combinations of these materials, or other suitable materials.

The thus-configured thin film transistor structure according to the present invention has high electron mobility and requires low production cost because the active pattern 109a is made of oxide semiconductor including silicon. Moreover, the fabrication process of the active pattern 109a can be performed at ambient temperature, thus making the process easy.

Accordingly, the thin film transistor structure according to the present invention may be applied to a variety of electronic devices, including driving or switching elements for flat panel displays, such as a liquid crystal display (hereinafter, LCD) and an organic light emitting diode (hereinafter, OLED), and devices for configuring peripheral circuits of memory devices.

A method for fabricating a thin film transistor for a display device according to the present invention will now be described with reference to FIGS. 8a to 8j.

FIGS. 8a to 8j are process cross-sectional views for explaining a method for fabricating a thin film transistor for a display device according to the present invention.

Figure 8A:
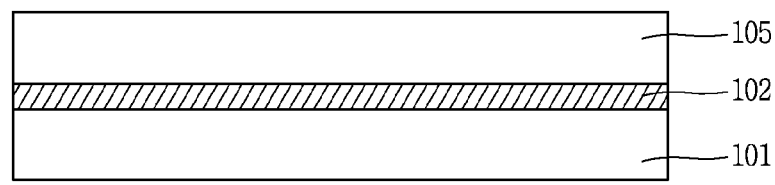
FIGS. 8a to 8j are process cross-sectional views for explaining a method for fabricating a thin film transistor for a display device according to the present invention.

Referring to FIG. 8a, a conductive material, e.g., Mo, for forming a gate electrode is deposited on a substrate 101 at about 3,500 to 4,000 Å to thereby form a first conductive material layer 102. The first conductive material layer 102 may be made of silicon, glass, plastic, or other suitable material, or made of a metal or other suitable conductive material. For example, the first conductive material layer 102 may be made of any one selected from the group consisting of indium tin oxide (ITO), indium gallium oxide (GZO), indium gallium zinc oxide (IGZO), indium gallium oxide (IGO), indium zinc oxide (IZO), indium zinc oxide (IZO), and $In_2O_3$, or two or more combinations of these materials, or other suitable materials. Alternatively, the first conductive material layer 102 may be made of any one selected from the group consisting of Al, W, Cu, Mo, Cr, Ti, MoW, MoTi, and Cu/MoTi, or two or more combinations of these materials, or other suitable materials. The deposition thickness of the conductive material is not limited to 3,500 to 4,000 Å, but may be less or greater than this range if necessary.

Next, photoresist is applied on top of the first conductive material layer 102 to form a first photoresist film 105.

Figure 8B:
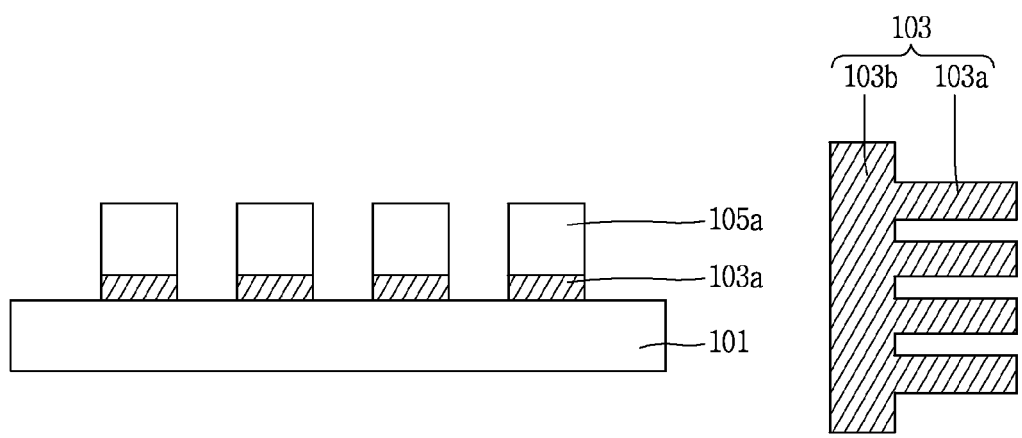

Next, referring to FIG. 8b, the first photoresist film 105 is exposed through a photolithography process using a first mask (not shown), and then developed and patterned, thereby forming a first photoresist film pattern 105a.

Next, the first conductive material layer 102 is selectively etched by using the first photoresist film pattern 105a as an etch mask, thereby forming a gate electrode 103. The gate electrode 103 has a given width and length, and includes a plurality of horizontal electrode parts 103a spaced at regular intervals and a vertical electrode part 103b. The gate electrode 103 may be formed by a printing process and/or a lift-off process, as well as by the above-mentioned photolithography process.

Figure 8C:
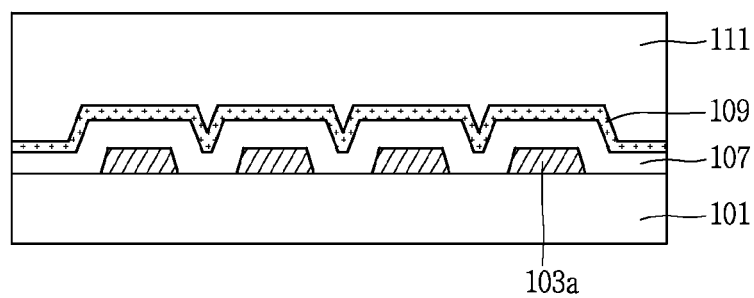

Next, referring to FIG. 8c, the first photoresist pattern 105a is removed, and an insulating material is deposited at about 3,000 to 4,000 Å over the entire surface of the substrate including the gate electrode 103, thereby forming a gate insulating film 107. The gate insulating film 107 may be formed by a sputtering process, a pulsed laser deposition (hereinafter, PLD) process, a printing process, a wet solution process, etc. The deposition thickness of the insulating material is not limited to 3,500 to 4,000 Å, but may be less or greater than this range if necessary.

The gate insulating film 107 may be made of any one selected from the group consisting of $SiO_2$, SiNx, $ZrO_2$, $HfO_2$, $TiO_2$, $Ta_2O_5$, and Ba—Sr—Ti—O, or two or more combinations of these materials, or other suitable materials.

Next, an active layer 109 is formed on the gate insulating film 107 to form a channel area through which electrons move between source and drain electrodes to be formed later. The active layer 109 may be formed by a sputtering process, a pulsed laser deposition (hereinafter, LPD) process, a printing process, a wet solution process, etc.

The active layer 109 may be made of oxide semiconductor containing silicon Si, low-temperature polysilicon (hereinafter, referred to as LTPS), or amorphous silicon (a-Si).

The oxide semiconductor includes Zn and one or more selected from the group consisting of Ge, Sn, Pb, In, Ti, Ga, and Al to which silicon (Si) is added. For example, the active pattern 109a may be made of Si—InZnO (SIZO) including InZnO to which silicon ions are added.

Particularly, the silicon ions control the electron concentration of InZnO to be suitable for a thin film transistor. Silicon has an electronegativity of about 1.8, and therefore has a difference in electronegativity of about 1.7 with oxygen having an electronegativity of about 3.5. Thus, silicon forms an oxide having a strong ionic bond.

Silicon has an ionic radius of about 0.040 nm, which is smaller than that of Zn, which has an ionic radius of about 0.074 nm and that of indium, which has an ionic radius of about 0.08 nm.

Accordingly, if the InZnO has silicon added thereto, an interstial solid solution may be generated.

Since the Si—InZnO is formed from an ionic bond, it has a relatively large electron cloud of cations. In the embodiment, the oxide semiconductor including silicon may be mainly formed of ionic groups, but all of the bindings need not be ionic bonds.

Although the characteristics of the active layer 109 have been described above with reference to SIZO, the active layer 109 made of SIZO shows good transistor characteristics even at a relatively low temperature. However, this is mere an illustration, and the active layer 109, which is made of oxide semiconductor including Zn and one or more selected from the group consisting of Ge, Sn, Pb, In, Ti, Ga, and Al to which silicon (Si) is added, has similar advantages to those of the active layer 109 made of SIZO.

In one embodiment, the active layer 109 made of oxide semiconductor including silicon may have a carrier concentration of about $10^8/cm^3$ to $10^{22}/cm^3$. The active layer 109 may be used as a channel element of the thin film transistor because it shows semiconductor device characteristics at a carrier concentration below about $10^{17}/cm^3$. Also, the active pattern 109a may be used as an electrode material because it shows similar characteristics to those of metals at a carrier concentration of about $10^{17}/cm^3$ to $10^{22}/cm^3$. For example, the active layer 109 may be used as a transparent conducting oxide (hereinafter, referred to as TCO). Especially, as the active layer 109 is deposited at a higher temperature, it becomes more applicable to an electrode.

If the active layer 109 is made of SIZO, the content ratio of Si atoms relative to the total content of Zn, In, and Si atoms in the active layer may range from about 0.001% by weight to about 30% by weight. The higher the content of Si atoms, the more strongly it controls electron generation. This may decrease mobility but improve the stability of the device.

The active layer 109 may further include elements of Group I such as Li and K, elements of Group II such as Mg, Ca, and Sr, elements of Group III such as Ga, Al, In, and Y, elements of Group IV such as Ti, Zr, Si, Sn, and Ge, elements of Group V such as Ta, Vb, Nb, and Sb, elements belonging to the lanthanide series such as La, Ce, Pr, Nd, Pm, Sm, Eu, Gd, Tb, Dy, Ho, Er, Tm, Yb, and Lu, or the like.

Next, photoresist is applied on the active layer 109 to form a second photoresist film 111.

Figure 8D:
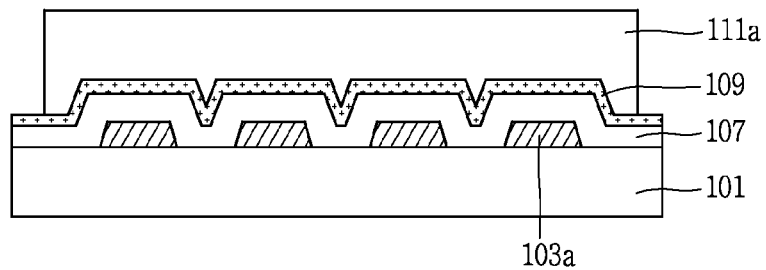

Next, referring to FIG. 8d, the second photoresist film 111 is exposed through a photolithography process using a second mask (not shown), and then developed and patterned, thereby forming a second photoresist film pattern 111a.

Figure 8E:
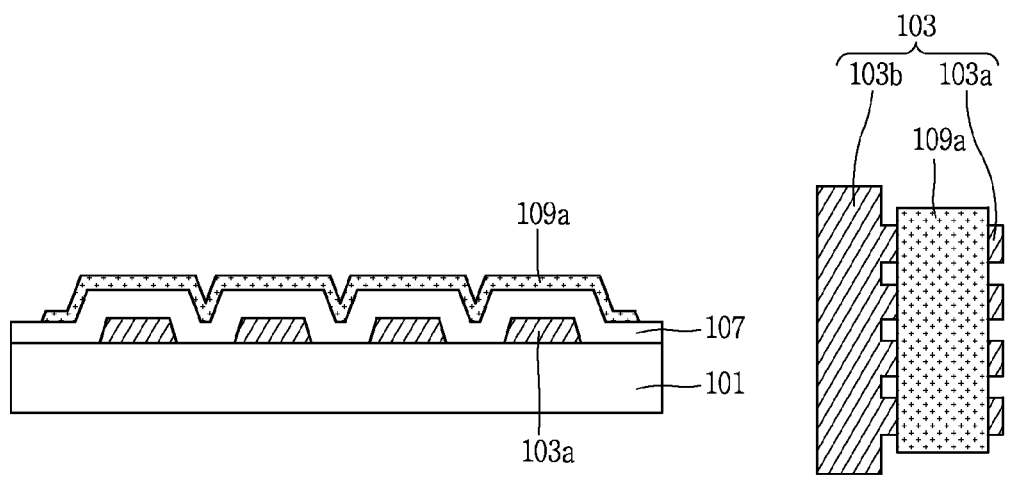

Next, referring to FIG. 8e, the active layer 109 is selectively etched by using the second photoresist film pattern 111a as an etch mask, thereby forming an active pattern 109a. The active pattern 109a is formed on the gate insulating film 107 above the plurality of horizontal electrode parts 103a and patterned in a given shape. The active pattern 109a perpendicularly overlaps the plurality of horizontal electrode parts 103a constituting the gate electrode 103.

Figure 8F:
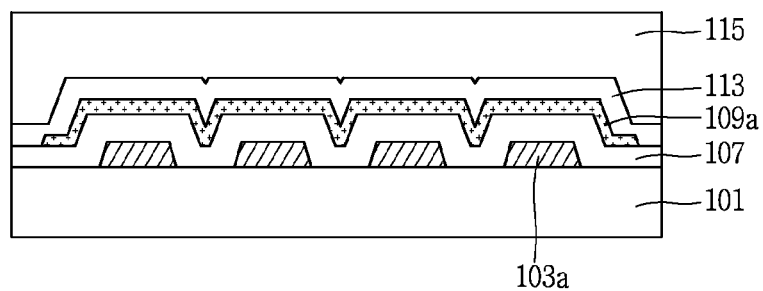

Next, referring to FIG. 8f, the second photoresist pattern 111a is removed, and an inorganic insulating material is deposited over the entire surface of the substrate including the active pattern 109a, thereby forming a etch stop film 113. The etch stop film may be formed by a sputtering process, a pulsed laser deposition (hereinafter, PLD) process, a printing process, a wet solution process, etc. The deposition thickness of the etch stop film 113 is not limited to 500 to 1,000 Å, but may be less or greater than this range if necessary.

The etch stop film 113 may be made of any one selected from inorganic insulating materials including $SiO_2$ and SiNx.

Next, photoresist is applied on the etch stop film 113 to form a third photoresist film 115.

Figure 8G:
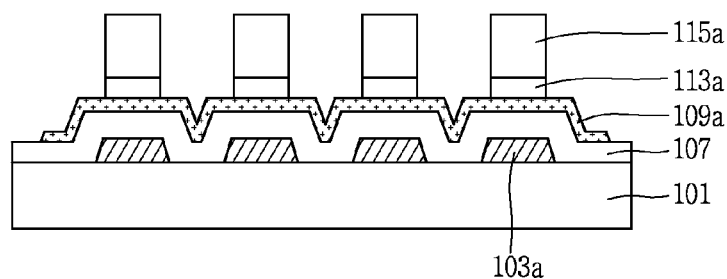

Next, referring to FIG. 8g, the third photoresist film 115 is exposed through a photolithography process using a third mask (not shown), and then developed and patterned, thereby forming a third photoresist film pattern 115a.

Figure 8H:
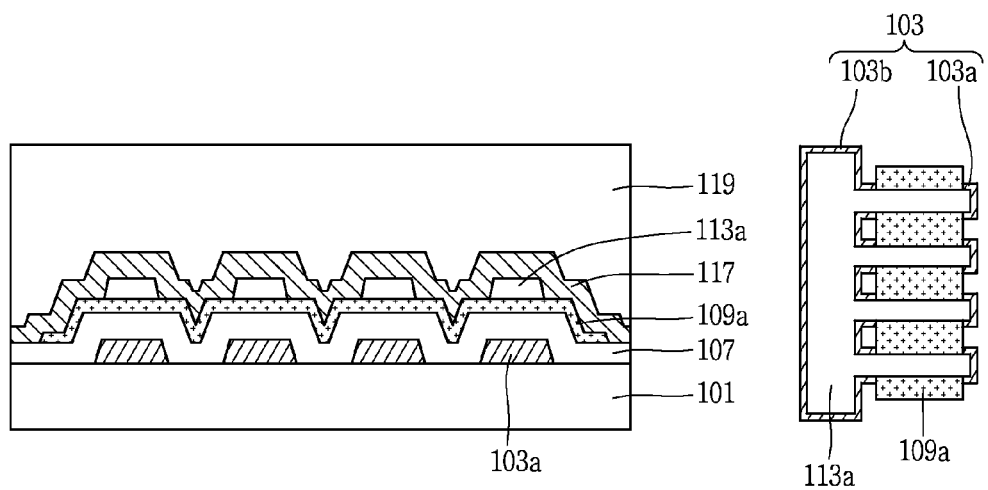

Next, referring to FIG. 8h, the etch stop film 113 is selectively etched by using the third photoresist film pattern 115a as an etch mask, thereby forming an etch stop film pattern 113a. The etch stop film pattern 113a overlaps top portions of the active pattern 109a and gate electrode 103, and is formed on top of the active pattern 109a and the gate insulating film 107.

Next, referring to FIG. 8h, the third photoresist pattern 115a is removed, and a conductive material, e.g., Mo, is deposited at about 3,000 to 4,000 Å over the entire surface of the substrate including the etch stop film pattern 113a, thereby forming a second conductive material layer 117. Like the first conductive material layer 107, the second conductive material layer 117 may be made of a metal or other suitable conductive material. For example, the second conductive material layer 112 may be made of any one selected from the group consisting of indium tin oxide (ITO), indium gallium oxide (GZO), indium gallium zinc oxide (IGZO), indium gallium oxide (IGO), indium zinc oxide (IZO), indium zinc oxide (IZO), and $In_2O_3$, or two or more combinations of these materials, or other suitable materials. Alternatively, the first conductive material layer 102 may be made of any one selected from the group consisting of Al, W, Cu, Mo, Cr, Ti, MoW, MoTi, and Cu/MoTi, or two or more combinations of these materials, or other suitable materials.

Next, photoresist is applied on the second conductive material layer 117 to form a third photoresist film 119.

Figure 8I:
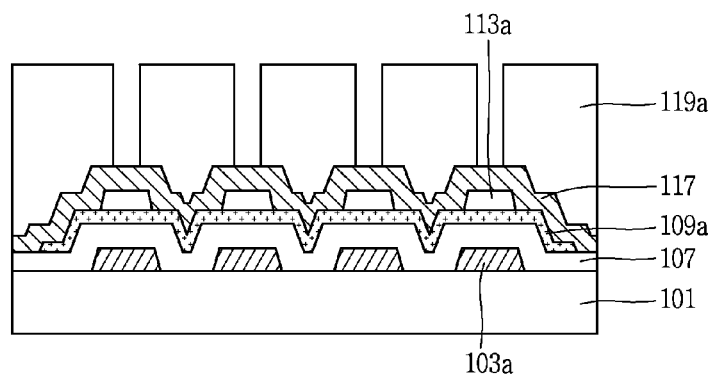

Next, referring to FIG. 8i, the fourth photoresist film 119 is exposed through a photolithography process using a fourth mask (not shown), and then developed and patterned, thereby forming a fourth photoresist film pattern 119a.

Figure 8J:
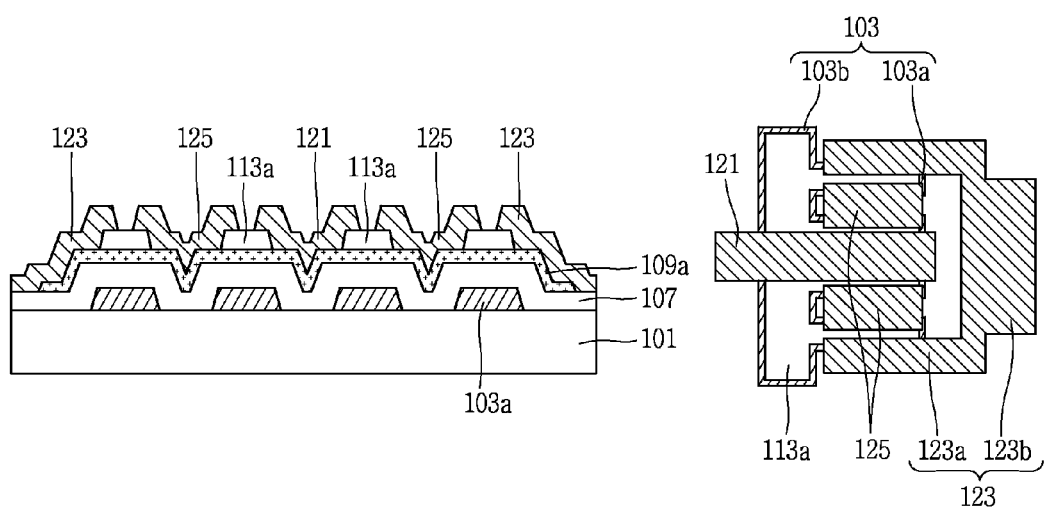

Next, referring to FIG. 8j, the second conductive material layer 117 is selectively etched by using the fourth photoresist film pattern 119a as an etch mask, thereby forming a source electrode 121, a drain electrode 123, and an offset pattern 125 simultaneously. The offset pattern 125 is formed between the source electrode 121 and the drain electrode 123. The offset pattern 125 overlaps top portions of adjacent horizontal electrode parts 103a of the gate electrode 103, and is formed on the active pattern 109a and the gate insulating film 107.

The offset pattern 125 is spaced apart from the source electrode 121 and the drain electrode 123, and disposed in parallel. The offset pattern 125 serves to reduce the off current Ioff of the thin film transistor structure. Particularly, if the active pattern 109a is made of low-temperature polysilicon (LTPS), the off current Ioff of the thin film transistor structure increases to thereby deteriorate the electrical characteristics of the thin film transistor. Thus, it is possible to suppress an increase in the off current $I_{off}$ of the thin film transistor by forming an offset pattern 125 between the source electrode 121 and the drain electrode 125 as described above. That is, the offset pattern 125 controls the flow of electric charges to the drain electrode 123 through the active pattern 109a, thereby suppressing an increase in the off current $I_{off}$ of the thin film transistor.

Also, the source electrode 121 perpendicularly overlaps the vertical electrode part 102b constituting the gate electrode 103, and is disposed between the horizontal electrode parts 103a located on the outermost ends.

Moreover, the drain electrode 123 is divided into at least two first electrode parts 123a and a second electrode part 123b. The two first electrode parts 123a overlap top portions of the horizontal electrode parts 103a located on the outermost ends.

Next, the fourth photoresist film pattern 119a is removed, thereby completing the fabrication process of the thin film transistor according to the present invention.

Figure 9:
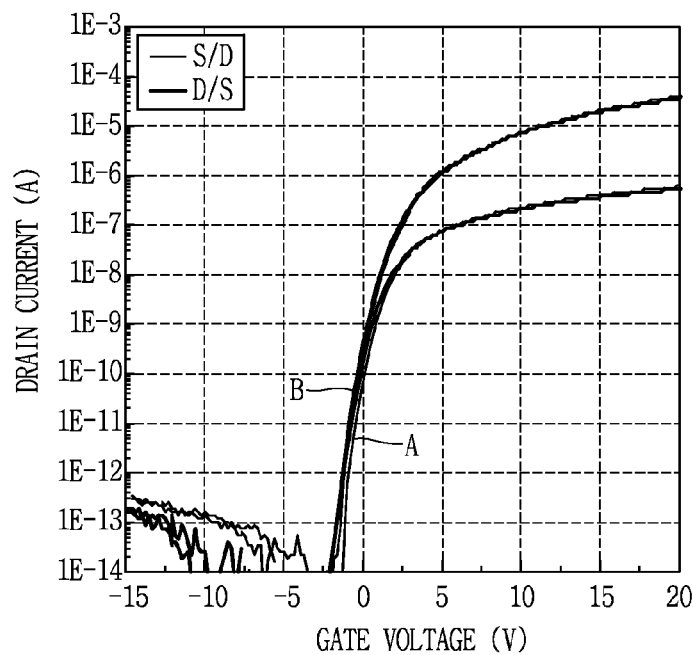
FIG. 9 schematically shows graphs of drain current versus gate voltage according to the thin film transistor structure of the present invention.

FIG. 9 schematically shows graphs of drain current versus gate voltage according to the thin film transistor structure of the present invention.

Graphs A and B are graphs of drain current versus gate voltage, in which the graph A shows a variation in the current flowing from the source electrode to the drain electrode, and the graph B shows a variation in the current flowing from the drain electrode to the source electrode.

Accordingly, as shown in FIG. 9, it can be found that there is little difference between the variation in the current flowing the source electrode to the drain electrode and the variation in the current flowing the drain electrode to the source electrode. Especially, there occurs a difference in overlap width between the source and drain electrodes overlapping the gate electrode due to misalignment during the fabrication of a thin film transistor. In the present invention, however, the gate electrode 103 includes a plurality of horizontal electrode parts 103a, and therefore any overlap difference between the source and drain electrodes 121 and 123 overlapping horizontal electrode parts 103a of the gate electrode 103 due to misalignment can be compensated for by adjacent other horizontal electrode parts 103a. Consequently, there is little difference between the variation in the current flowing the source electrode to the drain electrode as shown in the graph A and the variation in the current flowing the drain electrode to the source electrode as shown in the graph B.

Figure 10:
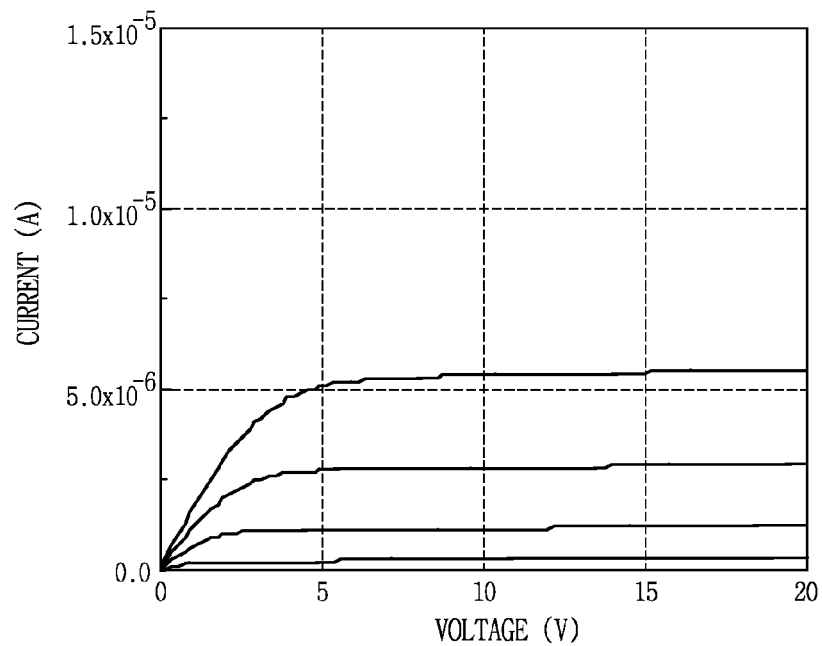
FIG. 10 schematically shows graphs of drain current versus voltage (drain-source voltage) according to the thin film transistor structure of the present invention.

FIG. 10 schematically shows graphs of drain current versus voltage (drain-source voltage) according to the thin film transistor structure of the present invention.

Accordingly, referring to FIG. 10, even if there is an overlap difference between the source and drain electrodes 121 and 123 overlapping horizontal electrode parts 103a of the gate electrode 103 due to misalignment during the fabrication of a thin film transistor, the overlap difference can be compensated for by adjacent other horizontal electrode parts. Consequently, there is little difference between the variation in the current flowing the source electrode to the drain electrode as shown in the graph A and the variation in the current flowing the drain electrode to the source electrode as shown in the graph B. Hence, it can be found that the drain current versus the drain-source voltage shows good output saturation characteristics.

The method for fabricating the thus-configured thin film transistor structure according to the present invention has high electron mobility and requires low production cost because the active pattern 109a is made of oxide semiconductor including silicon. Moreover, the fabrication process of the active pattern 109a can be performed at ambient temperature, thus making the process easy.

Accordingly, the method for fabricating a thin film transistor structure according to the present invention may be applied to a variety of electronic devices, including driving or switching elements for flat panel displays, such as a liquid crystal display (hereinafter, LCD) and an organic light emitting diode (hereinafter, OLED), and devices for configuring peripheral circuits of memory devices.

As discussed above, in the thin film transistor and the method for fabricating the same according to the present invention, the thin film transistor structure is varied such that a gate electrode includes a plurality of horizontal electrode parts and a drain electrode overlaps at least two horizontal electrode parts located on the outermost ends of the gate electrode. Even if there is an overlap difference between the source and drain electrodes overlapping horizontal electrode parts of the gate electrode due to misalignment, the overlap difference can be compensated for by adjacent other horizontal electrode parts. Consequently, there is little difference between the variation in the current flowing the source electrode to the drain electrode and the variation in the current flowing the drain electrode to the source electrode.

Moreover, in the thin film transistor and the method for fabricating the same according to the present invention, even if there is an overlap difference between the source and drain electrodes overlapping horizontal electrode parts of the gate electrode due to misalignment during the fabrication of a thin film transistor, the overlap difference can be compensated for by adjacent other horizontal electrode parts. Consequently, there is little difference between the variation in the current flowing the source electrode to the drain electrode and the variation in the current flowing the drain electrode to the source electrode. Hence, the drain current versus the drain-source voltage shows good output saturation characteristics.

Also, the method for fabricating the thin film transistor structure according to the present invention has high electron mobility and requires low production cost in the fabrication because the active pattern is made of oxide semiconductor including silicon. Moreover, the fabrication process of the active pattern can be performed at ambient temperature, thus making the process easy.

Further, according to the thin film transistor and the method for fabricating the same according to the present invention, even if the active pattern is made of LTPS, the off current Ioff of the thin film transistor can be reduce because an offset pattern is formed between the source electrode and the drain electrode.

Accordingly, the thin film transistor and the method for fabricating a thin film transistor structure according to the present invention may be applied to a variety of electronic devices, including driving or switching elements for flat panel displays, such as a liquid crystal display (hereinafter, LCD) and an organic light emitting diode (hereinafter, OLED), and devices for configuring peripheral circuits of memory devices.

As the present features may be embodied in several forms without departing from the characteristics thereof, it should also be understood that the above-described embodiments are not limited by any of the details of the foregoing description, unless otherwise specified, but rather should be construed broadly within its scope as defined in the appended claims, and therefore all changes and modifications that fall within the metes and bounds of the claims, or equivalents of such metes and bounds are therefore intended to be embraced by the appended claims.

What is claimed is:
1. A thin film transistor comprising:
a gate electrode formed on a substrate and having a plurality of horizontal electrode parts spaced apart at regular intervals;
a gate insulating film formed over the entire surface of the substrate including the gate electrode;

an active pattern formed on the gate insulating film above the plurality of horizontal electrode parts;

an etch stop film pattern formed above the active pattern and the gate insulating film so as to overlap top portions of the active pattern and the gate electrode and;

a source electrode formed on the active pattern, the gate insulating film, and the etch stop film pattern so as to overlap top portions of adjacent horizontal electrode parts;

a drain electrode formed on the active pattern, the gate insulating film, and the etch stop film pattern so as to overlap top portions of horizontal electrode parts located on the outermost ends; and an offset pattern formed between the source electrode and the drain electrode.

2. The thin film transistor of claim 1, wherein the offset pattern overlaps top portions of adjacent horizontal electrode parts, and is formed on the active pattern and the gate insulating film.

3. The thin film transistor of claim 1, wherein the active pattern perpendicularly overlaps the plurality of horizontal electrode parts constituting the gate electrode.

4. The thin film transistor of claim 1, wherein the source electrode is disposed to overlap top portions of adjacent horizontal electrode parts of the gate electrode.

5. The thin film transistor of claim 1, wherein the drain electrodes comprise at least two first electrode parts and a second electrode part connecting the first electrode parts together, and the at least two first electrode parts respectively overlap the two horizontal electrode parts located on the outermost ends.

6. The thin film transistor of claim 1, wherein the etch stop film pattern overlaps the plurality of horizontal electrode parts of the gate electrode.

7. The thin film transistor of claim 1, wherein the active pattern is made of oxide semiconductor, low-temperature polysilicon (LTPS), or amorphous silicon.

8. The thin film transistor of claim 7, wherein the oxide semiconductor includes Zn and one or more selected from the group consisting of Ge, Sn, Pb, In, Ti, Ga, and Al to which silicon (Si) is added, or includes elements of Group I such as Li and K, elements of Group II such as Mg, Ca, and Sr, elements of Group III such as Ga, Al, In, and Y, elements of Group IV such as Ti, Zr, Si, Sn, and Ge, elements of Group V such as Ta, Vb, Nb, and Sb, elements belonging to the lanthanide series such as La, Ce, Pr, Nd, Pm, Sm, Eu, Gd, Tb, Dy, Ho, Er, Tm, Yb, and Lu, or the like.

9. A method for fabricating a thin film transistor, the method comprising the steps of:

forming a gate electrode on a substrate and having a plurality of horizontal electrode parts spaced apart at regular intervals;

forming a gate insulating film formed the entire surface of the substrate including the gate electrode;

forming an active pattern on the gate insulating film above the plurality of horizontal electrode parts;

forming an etch stop film pattern above the active pattern and the gate insulating film so as to overlap top portions of the active pattern and the gate electrode;

forming a source electrode on the active pattern, the gate insulating film, and the etch stop film pattern so as to overlap top portions of adjacent horizontal electrode parts;

forming a drain electrode on the active pattern, the gate insulating film, and the etch stop film pattern so as to overlap top portions of horizontal electrode parts located on the outermost ends; and forming an offset pattern between the source electrode and the drain electrode.

10. The method of claim 9, wherein the step of forming the offset pattern is performed simultaneously with the step of forming the source electrode and the drain electrode.

11. The method of claim 9, wherein the active pattern perpendicularly overlaps the plurality of horizontal electrode parts constituting the gate electrode.

12. The method of claim 9, wherein the source electrode is disposed to overlap top portions of adjacent horizontal electrode parts of the gate electrode.

13. The method of claim 9, wherein the drain electrodes comprise at least two first electrode parts and a second electrode part connecting the first electrode parts together, and the at least two first electrode parts respectively overlap the two horizontal electrode parts located on the outermost ends.

14. The method of claim 9, wherein the etch stop film pattern overlaps the plurality of horizontal electrode parts of the gate electrode.

15. The method of claim 9, wherein the active pattern is made of oxide semiconductor, low-temperature polysilicon (LTPS), or amorphous silicon.

16. The method of claim 15, wherein the oxide semiconductor includes Zn and one or more selected from the group consisting of Ge, Sn, Pb, In, Ti, Ga, and Al to which silicon (Si) is added, or includes elements of Group I such as Li and K, elements of Group II such as Mg, Ca, and Sr, elements of Group III such as Ga, Al, In, and Y, elements of Group IV such as Ti, Zr, Si, Sn, and Ge, elements of Group V such as Ta, Vb, Nb, and Sb, elements belonging to the lanthanide series such as La, Ce, Pr, Nd, Pm, Sm, Eu, Gd, Tb, Dy, Ho, Er, Tm, Yb, and Lu, or the like.

\* \* \* \* \*